(12) United States Patent
Nakada et al.

(10) Patent No.: US 7,521,381 B2
(45) Date of Patent: Apr. 21, 2009

(54) METHOD FOR PRODUCING SILICON WAFER AND SILICON WAFER

(75) Inventors: Yoshinobu Nakada, Tokyo (JP); Hiroyuki Shiraki, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/432,861

(22) PCT Filed: Nov. 28, 2001

(86) PCT No.: PCT/JP01/10385

§ 371 (c)(1),
(2), (4) Date: May 28, 2003

(87) PCT Pub. No.: WO02/45149

PCT Pub. Date: Jun. 6, 2002

(65) Prior Publication Data

US 2004/0053516 A1    Mar. 18, 2004

(30) Foreign Application Priority Data

Nov. 28, 2000  (JP)  ............................ 2000-360913
May 9, 2001    (JP)  ............................ 2001-139216
Sep. 25, 2001  (JP)  ............................ 2001-291145

(51) Int. Cl.
  *H01L 21/26*  (2006.01)
  *H01L 21/42*  (2006.01)
  *H01L 23/48*  (2006.01)
  *H01L 23/52*  (2006.01)
  *H01L 29/40*  (2006.01)

(52) U.S. Cl. ...................... 438/795; 257/760; 257/759; 257/611

(58) Field of Classification Search ................. 438/795; 257/760, 618, 611, 759
See application file for complete search history.

(56) References Cited

U.S. PATENT DOCUMENTS

| 5,131,979 | A  | * | 7/1992 | Lawrence ................. 438/476 |
| 5,780,338 | A  | * | 7/1998 | Jeng et al. ................ 438/253 |
| 6,358,822 | B1 |   | 3/2002 | Tomomura |
| 6,503,594 | B2 | * | 1/2003 | Park ........................ 428/64.1 |
| 6,531,416 | B1 | * | 3/2003 | Kobayashi et al. ......... 438/795 |

(Continued)

FOREIGN PATENT DOCUMENTS

JP           64-1393       5/1989

(Continued)

OTHER PUBLICATIONS

David R. Lide, Handbook of Chemistry & Physics, 1982-1983, CRC Press, 63rd Edition, pp. B-104 and B-125.

(Continued)

Primary Examiner—Chuong A. Luu
(74) Attorney, Agent, or Firm—Pillsbury Winthrop Shaw Pittman, LLP (57) ABSTRACT

A silicon wafer is thermal-annealed in an atmosphere to form new vacancies therein by thermal annealing and the atmosphere in the thermal annealing contains a nitride gas having a lower decomposition temperature than a decomposable temperature of $N_2$ so that the thermal annealing is carried out at a lower temperature or for a short time to suppress generation of slip and to provide satisfactory surface roughness.

6 Claims, 10 Drawing Sheets

U.S. PATENT DOCUMENTS

| | | | |
|---|---|---|---|
| 6,663,708 B1 * | 12/2003 | Morita et al. | 117/3 |
| 6,676,753 B2 * | 1/2004 | Park | 117/217 |
| 6,828,690 B1 * | 12/2004 | Falster | 438/476 |
| 7,273,818 B2 | 9/2007 | Kurokawa | |
| 2002/0182342 A1 | 12/2002 | Ouellete et al. | |

FOREIGN PATENT DOCUMENTS

| | | | |
|---|---|---|---|
| JP | 11-92283 | | 6/1999 |
| JP | 11-092283 | * | 6/1999 |
| JP | 2001-351917 | * | 12/2001 |
| WO | WO 98/38675 | | 9/1998 |
| WO | WO 98/45507 | | 10/1998 |
| WO | 00/13211 | | 3/2000 |
| WO | 00/67299 | | 11/2000 |
| WO | 01/88974 | | 11/2001 |

OTHER PUBLICATIONS

Supplementary European Search Report dated Aug. 9, 2007 corresponding to Application No. EP 01 99 8993.

* cited by examiner

METHOD FOR PRODUCING SILICON WAFER AND SILICON WAFER

BACKGROUND OF THE INVENTION

1. Field of the Invention

The present invention relates to a production method for silicon wafers including forming vacancies in a silicon wafer by thermal annealing in atmosphere and forming a denuded zone (DZ) layer just under the surface of the silicon wafer by further thermal annealing, and to silicon wafers produced by this method.

2. Description of the Related Art

Silicon wafers produced by processing single crystal silicon which is obtained by pulling up and growing by Czochralski (CZ) method contain many oxygen impurities, and the oxygen impurities generate oxygen precipitates (BMD: bulk micro defect) causing dislocation, defects, or the like. When the oxygen precipitate is on the surface on which a device is to be formed, the oxygen precipitate causes increase in leakage current, decrease of dielectric breakdown voltage of oxide films, and the like, and as a result, characteristics of a semiconductor device are remarkably degraded.

Conventionally, thermal annealing (RTA: rapid thermal annealing) with rapid heating at high-temperature of 1250° C. or higher for a short time and rapid cooling is carried out on silicon wafers in the predetermined atmosphere to form vacancies with high concentration in thermal equilibrium in the silicon wafer. Subsequently, since the silicon wafer is frozen by rapid cooling while vacancies are out-diffused on the surface by thermal annealing, a DZ layer (a non-defect layer) is uniformly formed (for example, as disclosed in WO 98/38675). After forming the DZ layer, thermal annealing at lower temperatures than the above temperature, which allows formation and stabilization of oxygen precipitated nuclei, is carried out in order to form a BMD layer which has a gettering effect as a defect layer in the silicon wafer.

Furthermore, as another conventional technique (for example, disclosed in WO 98/45507), thermal annealing in an oxygen atmosphere is carried out on the silicon wafer, and subsequently, the thermal annealing in a non-oxidizing atmosphere is carried out, to form a DZ layer near the surface and a BMD in the silicon wafer.

In the thermal annealing for forming vacancies, conventionally, $N_2$ (nitrogen) has been mainly used as the atmosphere. Vacancies are injected into the silicon wafer by decomposing $N_2$ at high temperature and forming $Si_xN_y$ (nitride film) on the surface of the silicon wafer.

However, using the above-described thermal annealing for silicon wafers cannot solve the following problems.

Conventionally, the thermal annealing for forming vacancies is carried out in the atmosphere mainly containing $N_2$ after covering the surface of the silicon wafer with an oxide film. To obtain sufficient thermal annealing effects, thermal annealing at 1250° C. or higher for 10 seconds or more is necessary. As a result, slips are generated from parts being in contact with a susceptor, supporting pins, or the like, by the thermal annealing at high temperature in the silicon wafer. These slips may cause cracks or the like.

Furthermore, a natural oxide film is formed on the surface of the silicon wafer before thermal annealing. The natural oxide film on the surface of the silicon wafer sublimates during the above thermal annealing at high temperature, so that the surface of the silicon wafer becomes rough.

SUMMARY OF THE INVENTION

The present invention has been made to solve the above problems and an aspect thereof is the provision of a production method for silicon wafers and a silicon wafer wherein the thermal annealing is carried out at low temperature or for short time to suppress generation of slip and to provide satisfactory surface roughness.

To solve the above problems, the present invention provides a production method for silicon wafers including thermal annealing for forming vacancies in a silicon wafer by thermal annealing of the silicon wafer in atmosphere, wherein the atmosphere comprises a nitride gas having a lower decomposition temperature than a decomposable temperature of $N_2$.

In the production method for silicon wafers, the atmosphere used in the thermal annealing step comprises nitride gas such as $NH_3$, $NO$, $N_2O$, $N_2O_2$, hydrazine, dimethyl hydrazine, or the like, having a lower decomposition temperature than the decomposable temperature of $N_2$. Even if the thermal annealing is carried out at lower thermal annealing temperature or for shorter time than the thermal annealing temperature or thermal annealing time of $N_2$, the nitride gas is decomposed to form a nitride film on the surface of the silicon wafer. As a result, vacancies can be injected into the silicon wafer and the generation of slips in the thermal annealing can be suppressed.

Furthermore, in the production method for silicon wafers according to the present invention, the above nitride gas may comprise $NH_3$ (ammonia). The use of the nitride gas comprising $NH_3$ in the production method for silicon wafers enhances nitriding of the silicon wafer surface and injection of vacancies, because H (hydrogen) generated by decomposition of $NH_3$ has a cleaning effect that H strips the natural oxide film and the like on the surface of the silicon wafer. $NH_3$ has an effect of nitriding the oxide film, as a result, and the injection of vacancies in the silicon wafer is accelerated. The cleaning effect of $NH_3$ is not due to evaporation (sublimation) of the natural oxide film at high temperatures but due to deoxidation by hydrogen.

Furthermore, in the production method for silicon wafers according to the present invention, a concentration of $NH_3$ in the above nitride gas may be 0.5% or more or the flow rate of $NH_3$ may be 10 sccm or more. In this gas condition, the nitriding reaction is the reaction rate determinater. As long as the atmosphere comprises the nitride gas in this condition, the thickness of the nitride film formed on the surface of the silicon wafer is uniform, so that injection of vacancies into the silicon wafer can be uniformly carried out.

Furthermore, in the production method for silicon wafers according to the present invention, the above nitride gas may be a plasmatic nitride gas. Since the plasmatic nitride gas is activated, nitriding of the surface of the silicon wafer and injection of vacancies in the silicon wafer is further accelerated.

Furthermore, in the production method for silicon wafers according to the present invention, the above thermal annealing temperature may be within 900° C. to 1200° C. and the above thermal annealing time may be up to 60 seconds or shorter. According to the above range of thermal annealing temperature and thermal annealing time, generation of slips can be suppressed and a sufficient amount of vacancies can be injected in order to obtain suitable amount of BMD layer. Moreover, as described later, since the thermal annealing is carried out at 1200° C. or lower, less interstitial silicon is formed in the crystal. Therefore, pair annihilation between vacancies injected by the nitriding of the silicon wafer surface and interstitial silicon does not occur, so that injection efficiency is increased.

Furthermore, the production method for silicon wafers according to the present invention may comprise an oxide film stripping for stripping or thinning the oxide film on the surface of the silicon wafer before the thermal annealing. Since the production method for silicon wafers according to the present invention comprises an oxide film stripping for stripping or thinning the oxide film on the surface of the silicon wafer before the thermal annealing, the RTA is carried out under the condition in which the oxide film such as natural oxide film on the surface of the silicon wafer is completely or nearly completely stripped. As a result, it can promote nitriding of the surface of the silicon wafer by the nitride gas and injection of vacancies without disturbance by the oxide film, and the injection of vacancies is effectively carried out.

Furthermore, in the production method for silicon wafers according to the present invention, the oxide film may be thinned so as to be less than 2 nm thick when the atmosphere comprises $NH_3$ in the oxide film stripping. The present inventors found, as described later, that when the oxide film is formed with a thickness of 2 nm or more on the surface of the silicon wafer, the oxide film cannot be completely stripped or cannot be sufficiently converted to an oxynitride film during the thermal annealing (thermal annealing temperature is 900° C. to 1200° C. and thermal annealing time is up to 60 seconds). As a result, the sufficient effect of injection of vacancies cannot be obtained. In the oxide film stripping in the production method for silicon wafers, since the oxide film is thinned so as to be less than 2 nm thick when the atmosphere comprises $NH_3$, as described later, the remaining oxide film is sufficiently converted to an oxynitride film and a sufficient effect of injection of vacancies is obtained.

Furthermore, in the production method for silicon wafers according to the present invention, in the thermal annealing, the silicon wafer may be provided in a reaction chamber for the thermal annealing, and an atmosphere comprising nitride gas may be supplied into the reaction chamber after a purging treatment for removing oxygen contained in an atmosphere in the reaction chamber. In the production method for silicon wafers, since the atmosphere comprising nitride gas is supplied into the reaction chamber after a purging treatment for removing oxygen contained in an atmosphere in the reaction chamber, the atmosphere does not comprise oxygen so as to prevent suppression of the effect of injection of vacancies by surface oxidation.

The production method for silicon wafers according to the present invention may include forming a DZ layer on the surface layer of the silicon wafer at lower temperature than that in the thermal annealing step, and a precipitation treatment for precipitating oxygen in vacancies in the silicon wafer, after the thermal annealing. In the production method for silicon wafers, since the present invention comprises forming a DZ layer just under the silicon wafer surface at lower temperature than that in the thermal annealing, and a precipitation treatment for precipitating oxygen for utilizing the vacancies in the silicon wafer, after the thermal annealing, a high quality silicon wafer having a DZ layer, which is suitable for forming a device, as the surface layer, and also having a high BMD density area having a proximity gettering effect therein can be prepared.

A silicon wafer according to the present invention is provided with vacancies therein by the thermal annealing and is produced by the above production method for silicon wafers according to the present invention. Since the silicon wafer is produced by the above production method for silicon wafers according to the present invention, generation of slips is suppressed, and a high quality silicon wafer, which contains a DZ layer having sufficient thickness, and suitably high BMD density therein by the thermal annealing is obtained.

The silicon wafer according to the present invention is provided with vacancies therein by the thermal annealing, its surface may comprise a silicon oxynitride film formed by nitriding the surface thereof during the thermal annealing. Since the silicon wafer comprises a silicon oxynitride film formed by nitriding the surface thereof during the thermal annealing, that is, a silicon oxynitride film formed by nitriding the surface without evaporating a silicon oxide film such as a natural oxide film or oxygen during the thermal annealing, sufficient vacancies are injected into the silicon wafer by nitriding the surface and satisfactory surface roughness is exhibited with suppressing roughness of the surface. Therefore, the thermal annealing for oxygen precipitates to the silicon wafer produces a silicon wafer containing a BMD layer having high BMD density therein and a DZ layer having good surface roughness as a surface layer.

Furthermore, in the silicon wafer according to the present invention, a method for forming a non-defect layer as at least a surface layer and precipitating oxygen in the above vacancies in the silicon wafer is adopted. Since a non-defect layer as at least a surface layer is formed and oxygen is precipitated by utilizing the vacancies in the silicon wafer, the silicon wafer can comprise a preferable DZ layer as a device formed area and a BMD area having sufficient BMD density in the silicon wafer, and can exhibit the proximity gettering effect.

DETAILED DESCRIPTION

An embodiment of a production method for silicon wafers and a silicon wafer according to the present invention are explained with reference to FIGS. 1 to 5.

Figure 1:
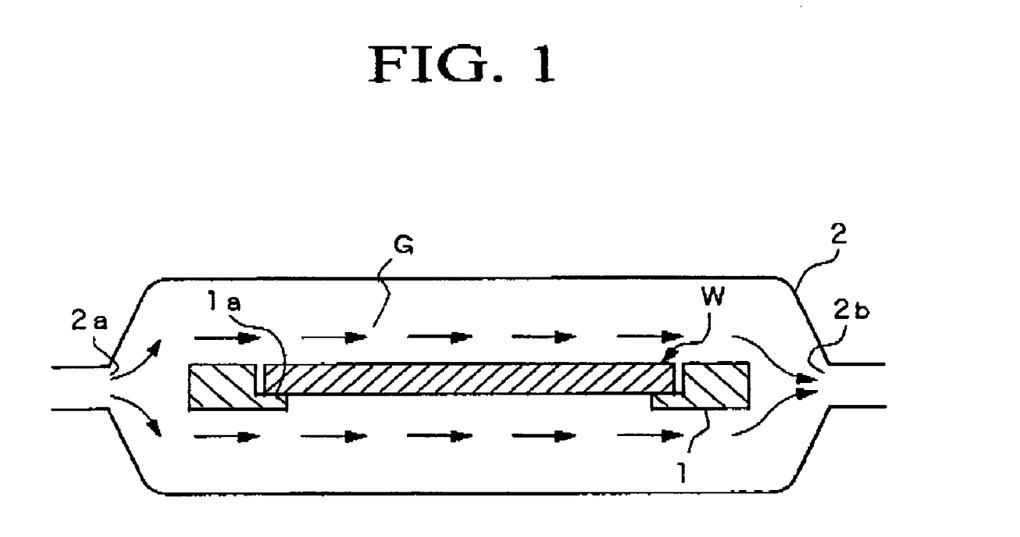
FIG. 1 is a schematic cross-sectional view showing a thermal annealing furnace of an embodiment in a production method for silicon wafers and a silicon wafer according to the present invention.

FIG. 1 is a single-type thermal annealing furnace for conducting a production method for silicon wafers according to the present invention. The thermal annealing furnace comprises annular susceptor 1 on which silicon wafer W can be provided, and reaction chamber 2 in which susceptor 1 is equipped. Furthermore, a lamp (not shown) is provided at the outside of reaction chamber 2 to heat the silicon wafer W.

Susceptor 1 is composed of a silicon carbide and the like, step portion 1a is provided in susceptor 1, and circumferential edge of silicon wafer W is provided on step portion 1a.

In reaction chamber 2, supply port 2a, which supplies atmosphere G on the surface of silicon wafer W, and discharge port 2b, which discharges supplied atmosphere G, are provided.

Furthermore, supply port 2a is connected to a supply source (not shown) of atmosphere G.

Atmosphere G is a nitride gas having lower decomposition temperature than $N_2$ decomposable temperature, such as $NH_3$, $NO$, $N_2O$, $N_2O_2$, hydrazine, dimethylhydrazine, and the like, or a mixed gas thereof, or a mixed gas of at least one of these nitride gasses and Ar, $N_2$, $H_2$, or the like. In the present embodiment, atmosphere G mainly comprises $NH_3$.

A method for forming new vacancies in the silicon wafer W by RTA (rapid thermal annealing) treatment of the silicon wafer W in the atmosphere in the thermal annealing furnace, and then a method of thermal annealing for forming a DZ layer on the surface of silicon wafer W and at the same time, forming a BMD layer in the silicon wafer W, are explained as follows.

First, it is preferable that a natural oxide film formed on the surface of silicon wafer W or an oxide film, which is generated by other treatments, be stripped or treated to be a thin film before RTA treatment for injecting vacancies. That is, the silicon wafer W before thermal annealing is washed by hydrofluoric acid or the like to strip the oxide film on the surface of silicon wafer W beforehand. The oxide film is thinned so as to be 2 nm thick. When the natural oxide film has less than 2 nm thick, stripping treatment of the oxide film is not necessary, as described below.

To carry out the thermal annealing, in particular, RTA treatment (rapid heating and rapid cooling), to the silicon wafer W in the thermal annealing furnace, the silicon wafer W is provided on susceptor 1, and then thermal annealing of rapid heating and rapid cooling (for example, increasing or decreasing temperature with 50° C./sec) for a short time at thermal annealing within 900° C. to 1200° C. for 60 sec or less during supplying the above atmosphere G from supply port 2a to the surface of silicon wafer W. This thermal annealing includes a spike annealing in which thermal annealing is carried out for a short time (less than 1 second).

As long as the thermal treatment is carried out within the temperature and time mentioned above, the generation of slip is suppressed and sufficient DZ layer density and BMD density is obtained by a two step thermal treatment (explained later). In the present embodiment, RTA treatment is carried out at further preferable conditions, that is, thermal annealing temperature of 900 to 1180° C. and thermal annealing time of 30 sec or shorter.

Figure 2A:
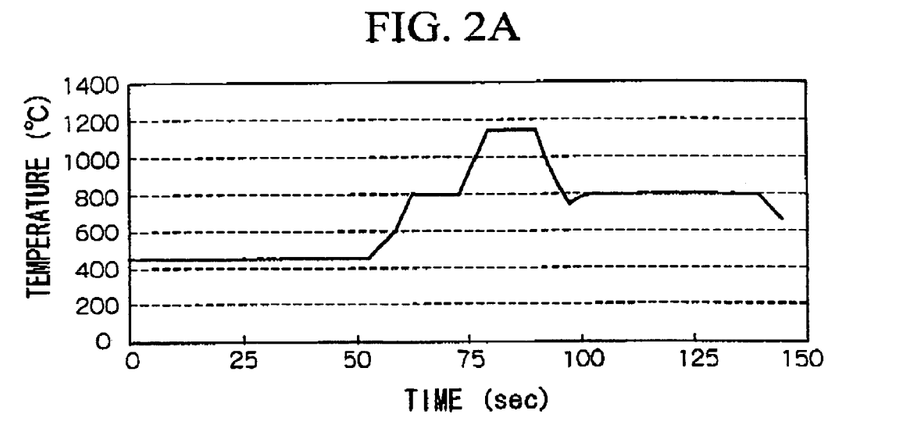
FIG. 2A is a graph showing a time chart of thermal annealing temperature of an embodiment in a production method for silicon wafers and a silicon wafer according to the present invention.
Figure 2B:
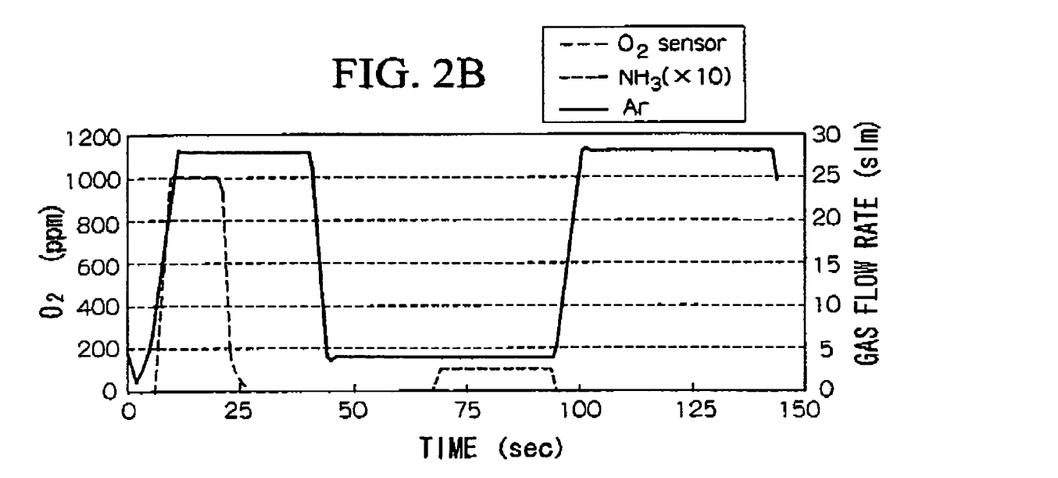
FIG. 2B is a graph showing a time chart of gas flow rate (slm) of an embodiment in a production method for silicon wafers and a silicon wafer according to the present invention.

In the above thermal annealing treatment, for example, as shown in FIGS. 2A and 2B, purging treatment is carried out for stripping oxygen by supplying a large amount of Ar into the thermal annealing furnace as an atmosphere to replace the atmosphere in the thermal annealing furnace before heating to 800° C. Subsequently, the silicon wafer W is heated to 800° C. while a predetermined current amount of Ar as the atmosphere is supplied.

Furthermore, while the predetermined amount of $NH_3$ is introduced into the thermal annealing furnace to mix with Ar for supplying a mixed gas of Ar and $NH_3$ as the atmosphere, rapid heating treatment is carried out to be the predetermined thermal annealing temperature (for example, 1180° C.) from 800° C., thermal annealing is carried out for the predetermined time at the thermal annealing temperature maintained regularly, and then rapid cooling is carried out to be 800° C.

Subsequently, the larger amount of Ar gas is supplied to susceptor 1 as the atmosphere with maintaining the temperature of 800° C. to completely substitute for $NH_3$, and then the temperature is decreased in the atmosphere of only Ar gas after exhaustion of $NH_3$ is completed. As described above, nitride gas having low decomposition temperature is supplied as the atmosphere from a certain point during increase of temperature to a certain point during rapid decrease of temperature. The thermal annealing temperature during the introduction of $NH_3$ gas is equal to the temperature (800° C.) during the purging treatment after the thermal annealing in order to relieve a load on the apparatus.

After the above thermal annealing, rapid cooling is carried out by taking silicon wafer W out of the thermal annealing furnace. The rapid cooling effect when the thermal annealing (800° C.) is carried out in the purging treatment and silicon wafer W is taken out makes it possible for oxygen donors in the silicon wafer to be stripped.

Figure 3A:
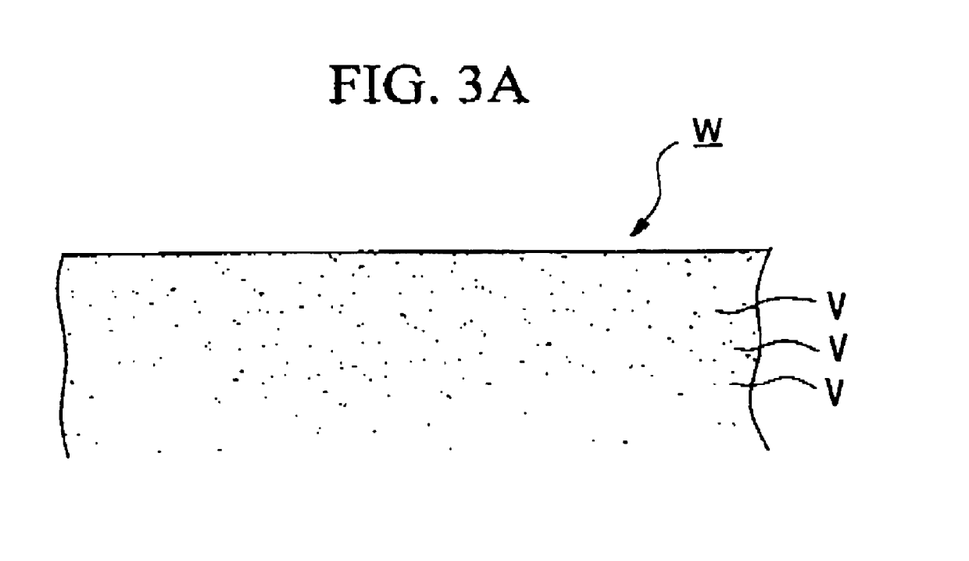
FIG. 3A is an enlarged cross-sectional view showing an RTA treated wafer of an embodiment in a production method for silicon wafers and a silicon wafer according to the present invention.

By the above thermal annealing, the surface of silicon wafer W undergoes nitriding by sufficiently decomposing a nitride gas at lower thermal annealing temperature than the conventional thermal annealing temperature, that is, a nitride film is formed on the surface of silicon wafer W, and then vacancies V are sufficiently injected into silicon wafer W, as shown in FIG. 3A.

Figure 3B:
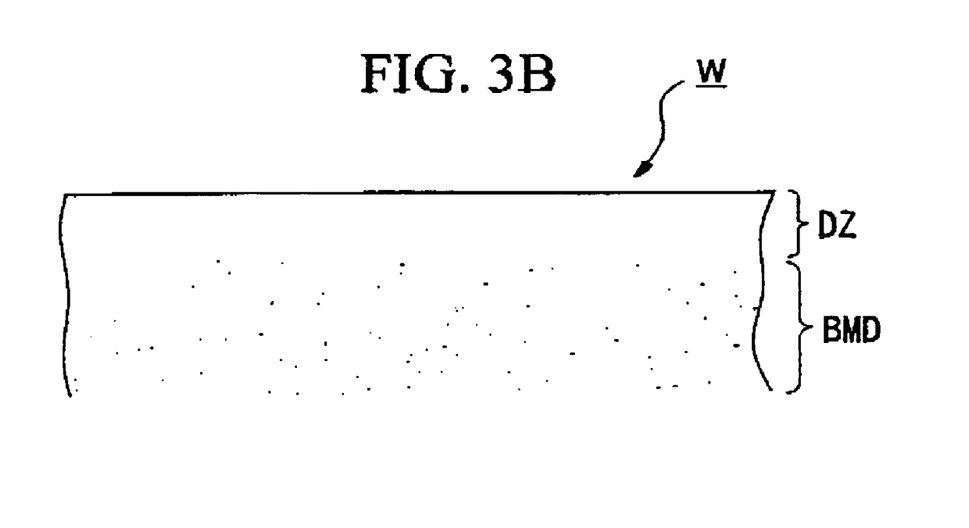
FIG. 3B is an enlarged cross-sectional view showing a thermal-annealed wafer for oxygen precipitates after RTA of an embodiment in a production method for silicon wafers and a silicon wafer according to the present invention.

Furthermore, in order to form oxygen precipitates in vacancies V at lower temperature than the annealing temperature in the RTA treatment, for example, thermal annealing at 800° C. for four hours under $N_2/O_2$ atmosphere is carried out in the thermal annealing furnace or the like after the RTA treatment. Accordingly, as shown in FIG. 3B, a denuded zone of a DZ layer is formed just under the silicon wafer surface by pair annihilation of vacancies which diffuse to the surface and interstitial silicons which are injected by formation of the oxide film, and while oxygen precipitate nuclei are stabilized. When the thermal annealing for longer time, for example, a thermal annealing at 1000° C. for 16 hours, Is carried out, oxygen precipitates grow and the BMD layer having high BMD density is formed therein.

The thermal annealing for formation of DZ layer and oxygen precipitates may not be carried out. The formation of DZ layer and oxygen precipitates may be carried out in a thermal annealing during a device preparing step.

In the present embodiment, since the atmosphere G is a nitride gas such as $NH_3$ having a lower temperature than the decomposable temperature of $N_2$, the thermal annealing temperature in the RTA treatment can be lower temperature and generation of slip during the thermal annealing can be suppressed.

By using atmosphere G mainly composed by $NH_3$, a cleaning effect for stripping natural oxide films and the like on the surface of silicon wafer W by hydrogen atom H generated by decomposing $NH_3$ occurs, so that nitriding and injection of vacancies V are accelerated. Furthermore, since $NH_3$ has a nitriding effect on oxide film, injection of vacancies V is accelerated.

In the present embodiment, since the thermal annealing is carried out within 900° to 1200° C. for 60 seconds or less, generation of slip can be suppressed and vacancies V can be sufficiently injected to obtain suitable amounts of BMD layer.

In the conventional high temperature thermal annealing over 1200° C., vacancies and interstitial silicon which are called Frenkel pairs are generated in crystals at the same time, so that vacancies injected in the RTA treatment are pair-annihilated with interstitial silicon. Accordingly, a density of vacancies that actually contribute to the formation of oxygen precipitation is decreased. On the other hand, in the present embodiment, since the thermal annealing is carried out at a low temperature of 1200° C. or less to decrease generation of Frenkel pairs, the amount of interstitial silicons formed in crystal is decreased; and vacancies, which are injected by a nitride film formed on the surface of silicon crystal, and interstitial silicons are not pair-annihilated, and injection efficiency of vacancies can be increased and vacancies V can be injected deeply into the crystal.

Furthermore, since oxide film on the surface of silicon wafer W is stripped or thinned, the RTA treatment is carried out under the condition in which oxide films such as natural oxide films on the surface of wafer W are completely or nearly completely stripped. As a result, disturbance of nitriding and vacancy injection at the surface of wafer W using nitride gas by oxide films can be prevented, and effective injection of vacancies can be carried out. Since the oxide film is thinned so as to be less than 2 nm thick, the remaining oxide film can be stripped or be an oxynitride film by cleaning effect or nitriding effect of $NH_3$, and vacancies V can be sufficiently injected.

Furthermore, after the RTA treatment, a thermal annealing is carried out on silicon wafer W at lower temperature than the temperature in the above thermal annealing to form a denuded zone of the DZ layer just under the surface, and at the same time, to form a bulk micro defect of the BMD layer by precipitating oxygen by utilizing the vacancies V in the silicon wafer. Accordingly, high performance silicon wafers wherein a denuded zone of the DZ layer, which is suitable for a device formation, is formed on the surface of the silicon wafer and a bulk micro defect of the BMD layer having high BMD density having a proximity gettering effect in the silicon wafer, can be manufactured.

The present invention is not limited to the above embodiment, but rather the design can be altered and the like within a range that does not deviate from the purpose of the present invention.

In the above embodiment, for example, the thermal annealing temperature is decreased in comparison with a conventional example. However, the thermal annealing temperature being high thermal annealing temperature which is the same as that of $N_2$ as an atmosphere may be used, in this case, the thermal annealing can be carried out for a shorter time than that of $N_2$. Similarly, when the thermal annealing temperature is carried out at low thermal annealing temperature, generation of slip can be remarkably decreased.

Furthermore, the above plasmatic nitride gas may be used as an atmosphere. In this case, since the plasmatic nitride gas is activated, nitriding of the surface of the silicon wafer and injection of vacancies into the silicon wafer is further accelerated.

If the atmosphere is a mixed gas composed of three kind gasses, one or more of the gasses may be nitride gases such as. $NH_3$.

If the atmosphere is a mixed gas composed of two kind gases, it is preferred that the nitride gas contained in the mixed gas have a smaller amount of 0.5% or more, or 10 sccm or more based on the absolute amount. The nitriding reaction in this range is a rate determination. As long as the mixed gas contains the nitride gas having the minimum amount or more, each nitride film formed on the surface of the silicon wafer has the same film thickness. As a result, each concentration of vacancies to be introduced and each amount of precipitation are the same. Within the range of 0.05% or more and less than 0.5%, or more than 1 sccm to 10 sccm or less, if nitriding reactions are carried out at the same temperature for the same time, the amount of nitride in the nitride film changes dependent of partial pressure of nitrogen. Accordingly, the nitriding reaction in this range is a diffusion control, and the precipitation amount of oxygen is controlled by controlling the, amount of nitrogen.

Furthermore, the pressure of the atmosphere can be any of decompression, normal pressure, and pressurizing.

The nitride film and the oxynitride film (silicon nitride-oxide film) formed on the surface of the silicon wafer in the above embodiment is $Si_xN_y$ such as $Si_3N_4$. When nitriding the oxide film, $Si_2N_xO_y$ such as $Si_2N_2O$ is formed, that is, a silicon oxide-nitride film is formed. This silicon oxide-nitride film is formed by nitriding a natural oxide film, chemical oxide film, or thermal oxide film.

These nitride films may further contain hydrogen in the films.

In the above embodiment, natural oxide films may be formed on the surface of a silicon wafer before thermal annealing treatment. Even if there are the oxide films such as natural oxide films, a sufficient vacancy injection effect can be obtained by a cleaning effect using $NH_3$ or the like, or by nitriding of oxide films.

However, when a thicker oxide film than a natural oxide film is formed on the surface of the silicon wafer by carrying out the thermal annealing using atmosphere containing oxygen before carrying out the thermal annealing using the above nitride gas such as $NH_3$, the vacancy injection effect by nitriding the surface of the silicon wafer using $NH_3$ or the like cannot be sufficiently obtained. Since the oxide film on the surface is thick, the nitride film (comprising the oxynitride film) having satisfactory vacancy injection effect cannot be formed on the surface of the silicon wafer even if the thermal annealing is carried out under atmosphere such as $NH_3$.

Therefore, it is not preferred that an oxide film which has a greater thickness than that of a natural oxide film be actively formed on the surface of the silicon wafer before the thermal annealing using the above nitride gas such as $NH_3$ in the present embodiment, and a process such as a thermal annealing in atmosphere containing oxygen is carried out before the thermal annealing using the above nitride gas such as $NH_3$. Furthermore, in the present embodiment, it is preferred that the purging treatment for removing oxygen contained in the atmosphere be carried out before supplying the above nitride gas such as $NH_3$ to the reaction chamber The formation of the above silicon oxide-nitride film by the above RTA treatment is explained with reference to FIGS. 4A to 4C.

Figure 4A:
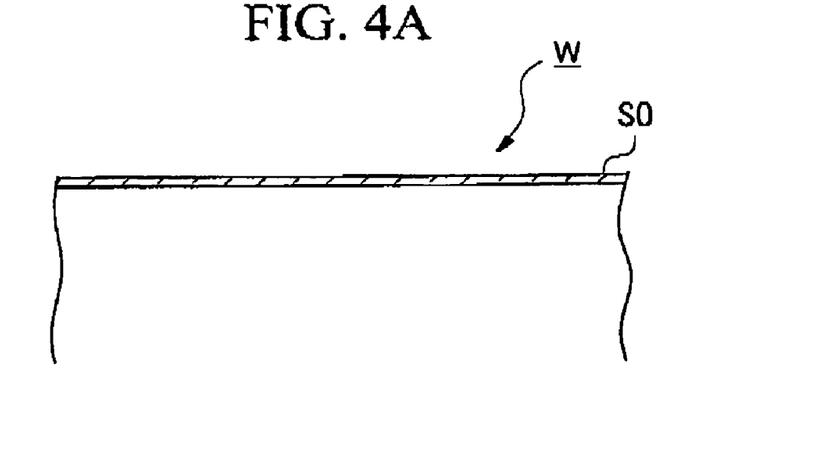
FIG. 4A is an enlarged cross-sectional view showing wafers before RTA treatment according to the present invention.
Figure 4B:
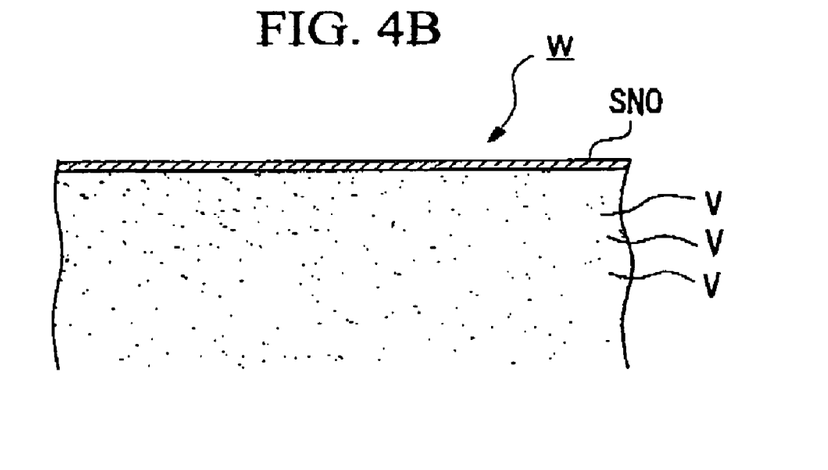
FIG. 4B is an enlarged cross-sectional view showing wafers just after RTA treatment when a silicon oxynitride film is formed on the surface of the silicon wafer according to the present invention.

As shown in FIG. 4A, a natural oxide film (silicon oxide film, SO) is formed on the surface of silicon wafer W before thermal annealing, and oxide film stripping treatment is not particularly carried out. In this condition, the above-described RTA treatment is carried out so that the natural oxide film (SO) and silicon on the surface of silicon wafer W is nitrided by $NH_3$, and accordingly, as shown FIG. 4B, vacancies V are injected into silicon wafer W, and a silicon nitride-oxide film (SNO) is formed on the surface of silicon wafer W.

Figure 4C:
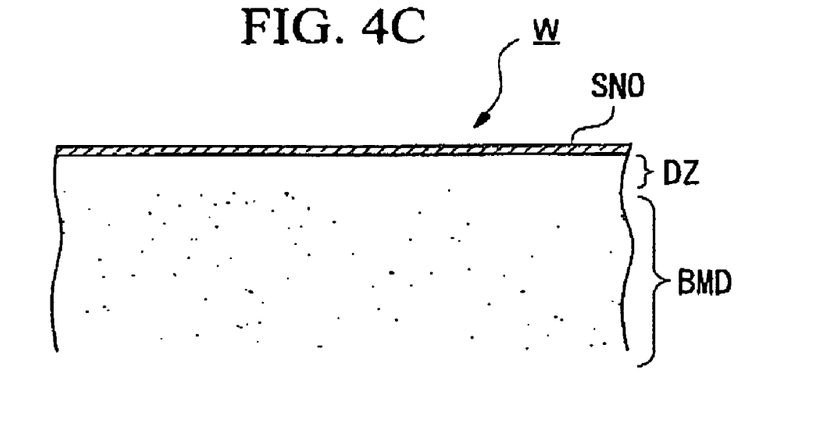
FIG. 4C is an enlarged cross-sectional view showing a thermal-annealed wafer for oxygen precipitates after RTA of an embodiment in a production method for silicon wafers and a silicon wafer according to the present invention.

Since the silicon wafer has an oxynitride film formed by nitriding the surface thereof in the thermal annealing, that is, has a silicon nitride-oxide film SNO formed by nitriding a natural oxide film SO on the surface thereof in the thermal annealing, the silicon wafer comprises sufficient vacancies V injected therein by nitriding the surface thereof and satisfactory surface roughness which is suitably suppressed. If further thermal annealing for oxygen precipitates is carried out to the silicon wafer, as shown in FIG. 4C, a silicon wafer containing a BMD of a BMD layer having high BMD density therein and a DZ of a DZ layer having satisfactory surface roughness can be obtained.

Furthermore, silicon wafers processed by slicing ingots, which are obtained by pulling up and growing by normal CZ method, are used in the above embodiment; however, silicon wafers processed by slicing ingots, which are obtained by pulling up and growing by another CZ method, may be used. For example, as the above-described silicon, wafers, silicon wafers in which there is no agglomerate of point defects processed by slicing ingots composed of perfect area [P], may be used, when an area where interstitial silicon type point defects mainly exist, is defined as area [I], an area where vacancy type point defects mainly exist, is defined as area [V], and an area where agglomerate of interstitial silicon type point defects and agglomerate of vacancy type point defects exist, is defined as perfect area [P] in silicon single crystal ingots. The vacancy type point defect is a defect formed by a vacancy generated by displacing a silicon atom from a silicon lattice site, and the interstitial silicon type point defect is a defect in which a silicon atom is in a position other than a lattice point of the silicon crystal (interstitial site).

The silicon wafer composed of perfect area [P] is, for example, as suggested in Japanese Unexamined Patent Application, First Publication No. 64-1393, produced by pulling up ingots from a molten silicon in a hot zone according to a CZ method with the pulling rate profile based on Voronkov theory, and subsequently, slicing these ingots. The ingots are made with determining a value of V/G ($mm^2$/min-° C.) so as to annihilate oxidation induced stacking faults (OSFs) in the center of silicon wafer, which are generated like rings by the thermal oxidation treatment, where pulling rate is V (mm/min) and temperature gradient in the vertical direction of the ingots near the interface between the molten silicon and the ingots in a crucible is G (° C./mm).

Figure 5:
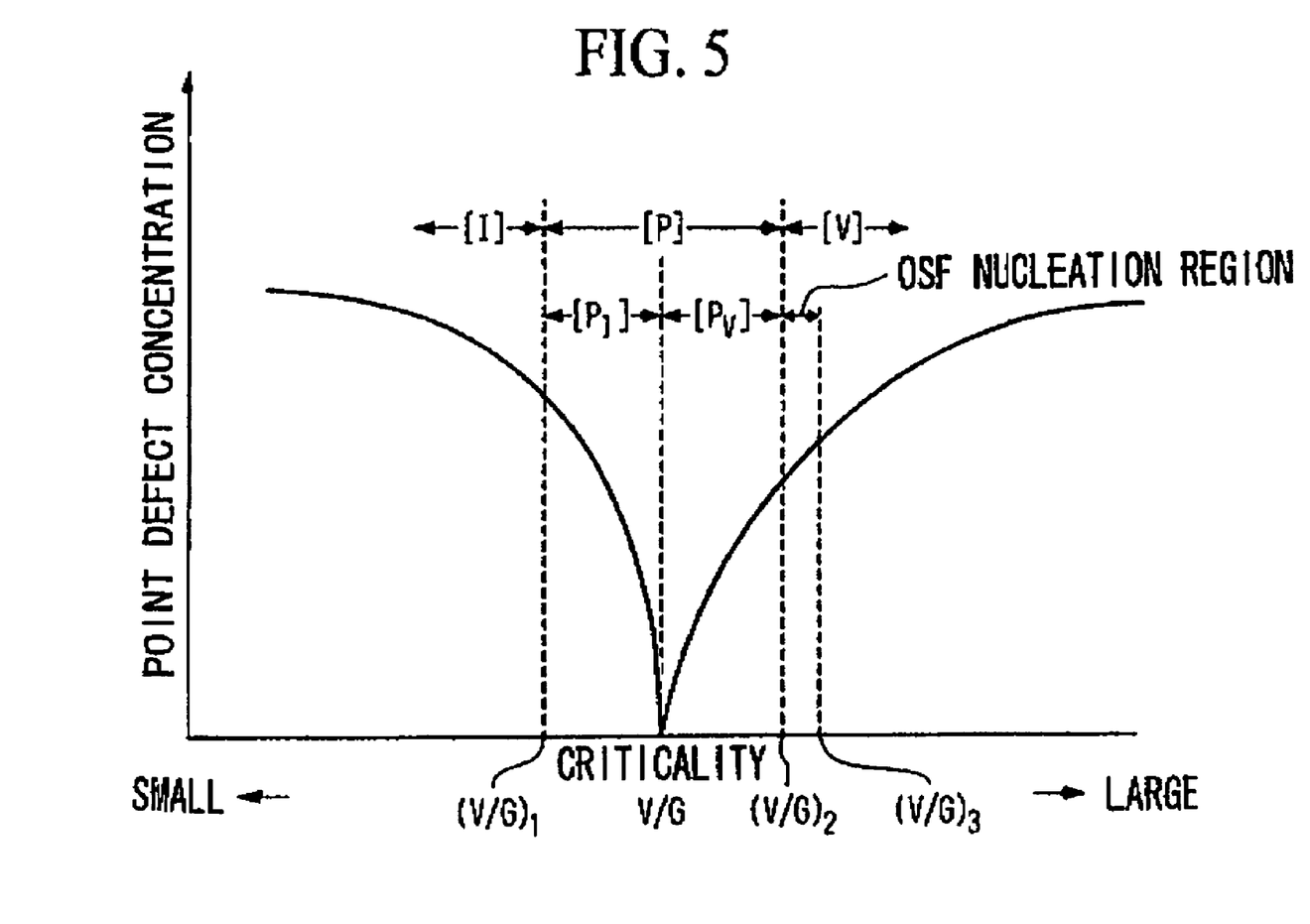
FIG. 5 is a graph showing a relationship based on Voronkov theory, in which a vacancy rich ingot is formed when V/G is more over critical point and an interstitial silicon rich ingot is formed when V/G is less than critical point, and a perfect area is within the first critical ratio $((V/G)_1)$ or more and the second critical ratio $((V/G)_2)$ or less.

As shown in FIG. 5, the above-described Voronkov theory schematically, expresses a relationship between V/G and point defect concentration when V/G is plotted on the horizontal. axis and vacancy type point defect concentration and interstitial silicon type defect concentration are plotted on the vertical axis, and explains that the interface between a vacancy area and interstitial silicon area is determined according to the value of V/G In particular, when V/G ratio is more than the critical point, ingots having rich vacancy type point defect concentration are formed. When V/G ratio is less than the critical point, ingots having rich interstitial silicon type point defect concentration are formed. In FIG. 5, [I] where the interstitial silicon type point defects richly exist indicates the area where agglomerates of interstitial silicon type point defects exist (area of smaller than $(V/G)_1$), [V] where the vacancy type point defects richly exist indicates the area where agglomerates of vacancy type point defects exist (area of larger than $(V/G)_2$), and [P] indicates the perfect area where no agglomerate of interstitial silicon type point defects and no agglomerate of vacancy type point defects exist (area between $(V/G)_1$ and $(V/G)_2$). The area [V] adjacent to the area [P] comprises an area [OSF] (area between $(V/G)_2$ and $(V/G)_3$) in which OSF nuclei are formed.

When ingots are pulled up from the molten silicon in the hot zone, the pulling rate profile of ingots to be silicon wafers is determined so that the ratio (V/G) of pulling rate to temperature gradient is the first critical ratio $((V/G)_1)$ or larger to prevent generation of agglomerates of interstitial silicon type point defects, and is the second critical ratio $((V/G)_2)$ or smaller to suppress agglomerate of vacancy type point defects within the area where numerous vacancy type point defects exist in the center of the ingot.

The pulling rate profile is determined by experimentally slicing a reference ingot in the axial direction and numerical simulations based on Voronkov theory.

The silicon wafer produced in the perfect area [P] becomes a silicon wafer having no defect such as OSF and COP. Since this silicon wafer has low IG (intrinsic or internal gettering) effect, if the thermal annealing according to the above-described embodiment is carried out, a BMD layer having sufficiently high density can be formed therein, so that proximity gettering effect can be obtained.

Detection sensitivity and detectable lower limit value of agglomerates of point defects such as COP depends on detection methods. "No agglomerate of point defects exist" described in the application means that the number of agglomerate of point defects is the detectable lower limit value or lower. The detectable lower limit value ($1 \times 10^3 / cm^3$) is defined as one defect being detectable in $1 \times 10^{-3}$ $cm^3$ of the control volume in each agglomerate of flow pattern (vacancy type defect) and dislocation cluster (interstitial silicon type point defect). The control volume is defined as the product of observation area and area to be etched away which are observed by an optical microscope after non-stirring Secco etching of a mirror-polished single crystal silicon.

Next, the production method for silicon wafers and silicon wafer according to the present invention are explained by examples.

Figure 6:
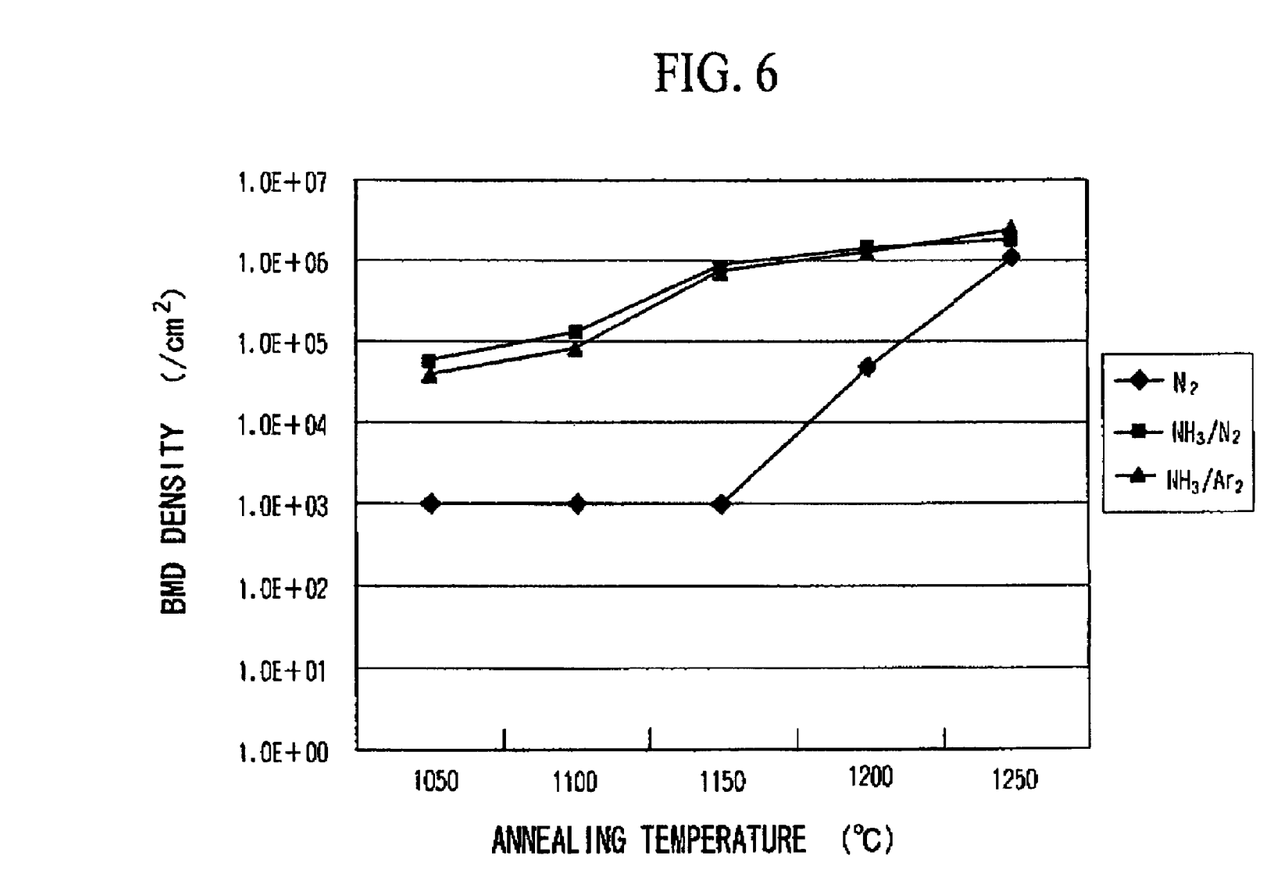
FIG. 6 is a graph showing a relationship between thermal annealing temperature and BMD density in the thermal-annealed wafer for oxygen precipitates after RTA of an embodiment in a production method for silicon wafers and a silicon wafer according to the present invention.
Figure 7:
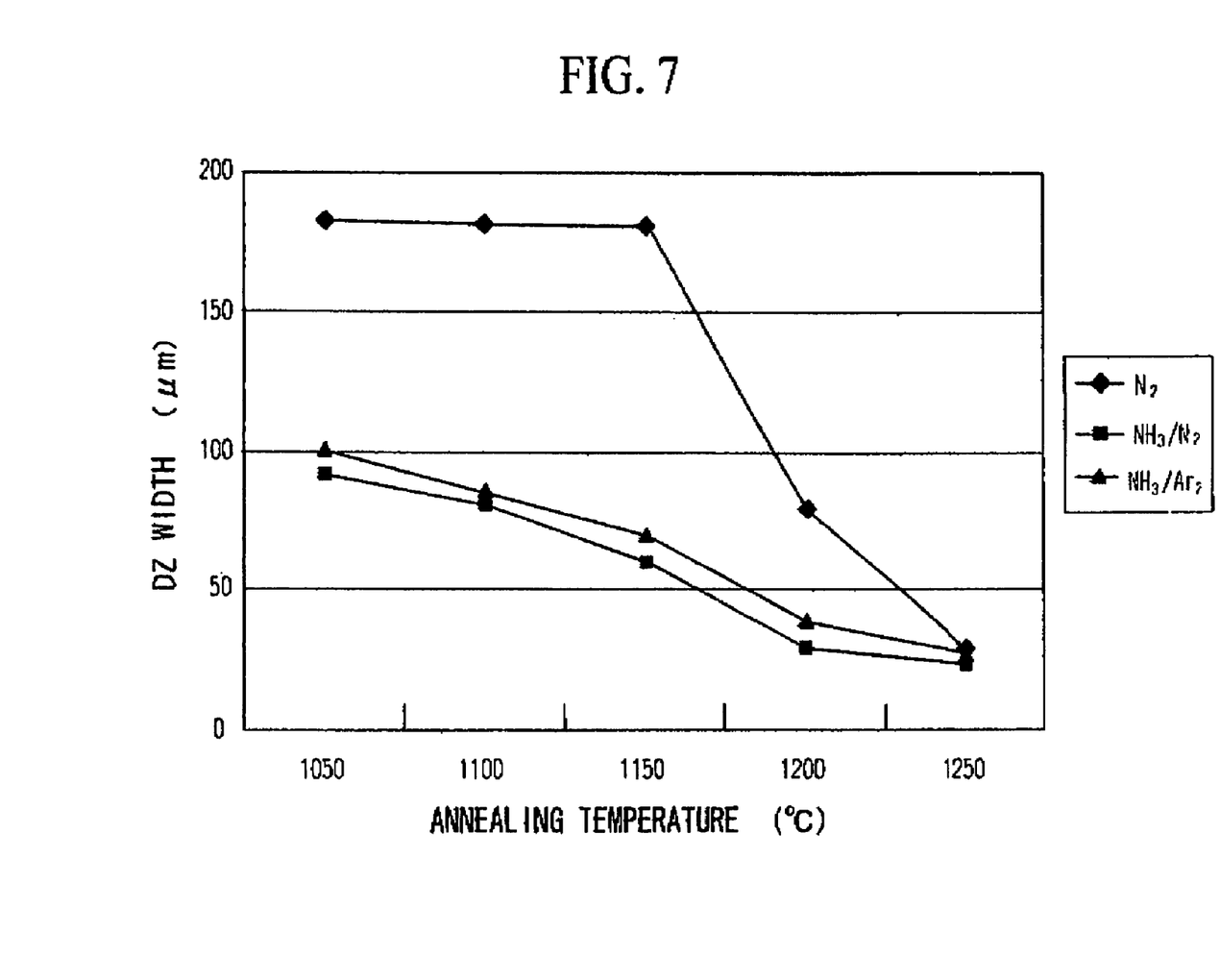
FIG. 7 is a graph showing a relationship between thermal annealing temperature and DZ width in the thermal-annealed wafer for oxygen precipitates after RTA of an embodiment in a production method for silicon wafers and a silicon wafer according to the present invention.

The relationship between thermal annealing temperature (annealing temperature) and BMD density when each of NH$_3$/Ar: 2SLM/2SLM and NH$_3$/N$_2$: 2SLM/2SLM actually flowed as an atmosphere according to the above-described embodiment, is shown in FIG. 6. Similarly, the relationship between thermal annealing temperature and DZ width when each of NH$_3$/Ar: 2SLM/2SLM and NH$_3$/N$_2$: 2SLM/2SLM actually flowed as an atmosphere, is shown in FIG. 7. As a conventional example, the above relationships when N$_2$: 4SLM flowed as an atmosphere are further shown in FIGS. 6 and 7. As shown in FIGS. 6 and 7, when the thermal annealing using NH$_3$ as the atmosphere according to the present invention was carried out, higher BMD density than that obtained by conventional thermal annealing is obtained, even if at low thermal annealing temperature, and at the same time, practically satisfactory DZ width is obtained.

Figure 8:
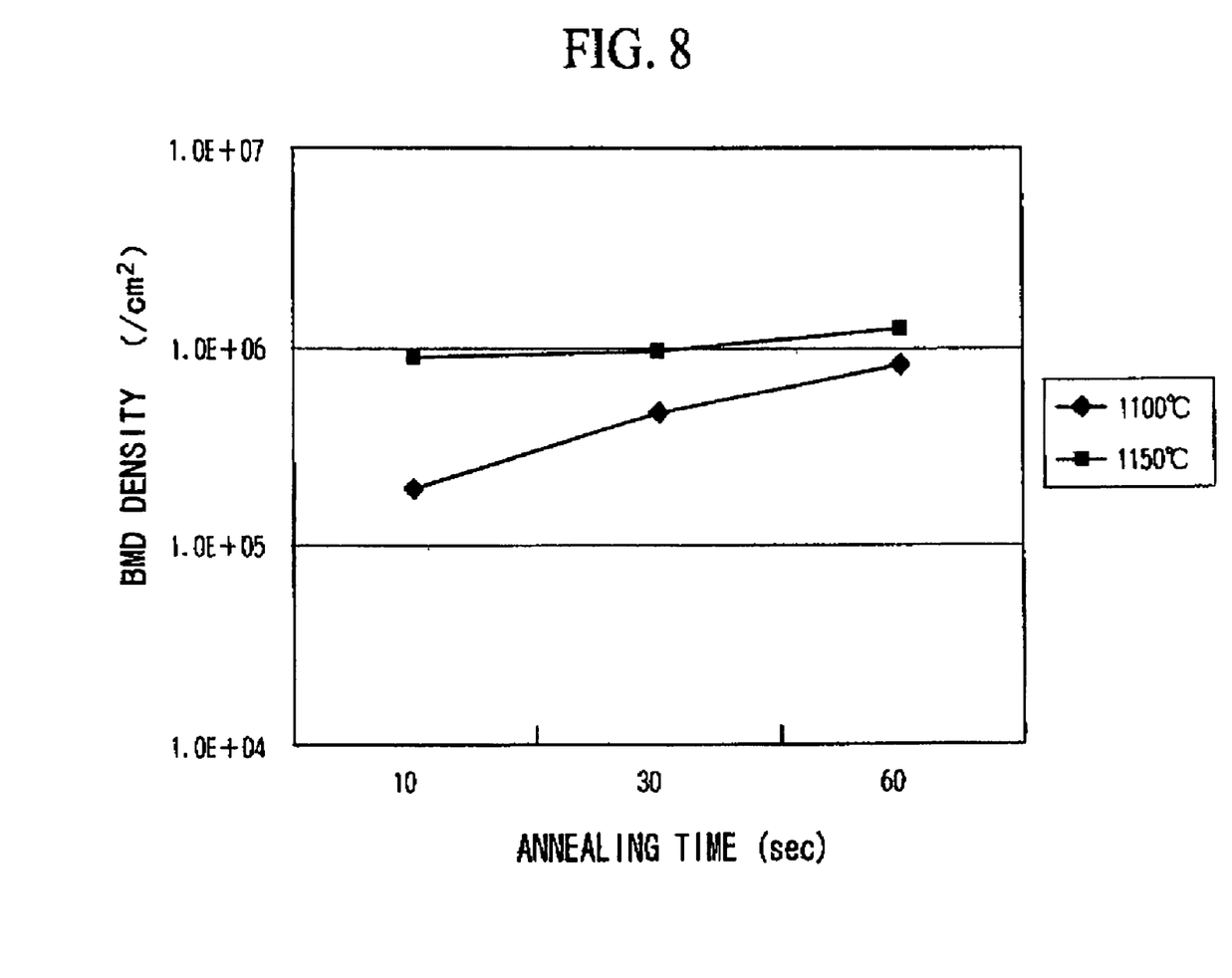
FIG. 8 is a graph showing annealing time dependence of BMD density in the thermal-annealed wafer for oxygen precipitates after RTA at thermal annealing temperature of 1100° C. and 1150° C. of an embodiment in a production method for silicon wafers and a silicon wafer according to the present invention.

Furthermore, the relationship between thermal annealing temperature and BMD density when the thermal annealing temperature is 1100° C. or 1150° C. using NH$_3$/Ar: 2SLM/2SLM as an atmosphere, is shown in FIG. 8. As shown in FIG. 8, when thermal annealing was carried out for the same thermal annealing time, higher BMD density was obtained at 1150° C. which is higher than 1100° C. The difference in BMD density between 1100° C. and 1150° C. gradually increases as thermal annealing time decreases.

Moreover, various experiments under various conditions were carried out. As a result, according to the present invention, satisfactory BMD density is obtained even if thermal annealing is carried out at lower temperature than that in the conventional method, and simultaneously, BMD density is almost unchanged even if flow rate in the atmosphere such as the above nitride gas is changed in the present invention. Furthermore, it is found that oxygen precipitates is increased when cooling rate is increased.

It is found that the slip length is shorter when thermal annealing is carried out at lower temperature, and when cooling rate is larger. Furthermore, when the atmosphere contains ammonia, it is found that the smaller the amount of ammonia leads to the shorter slip length. This reason is considered that hydrogen (H) having relatively high thermal conductivity decreases, as the amount of ammonia becomes smaller. Therefore, if thermal annealing is carried out using relatively low flow rate of the atmosphere containing ammonia at relatively low temperature, and cooling is carried out with large cooling rate, generation of slip can be suppressed and satisfactory BMD density can be obtained.

Figure 9:
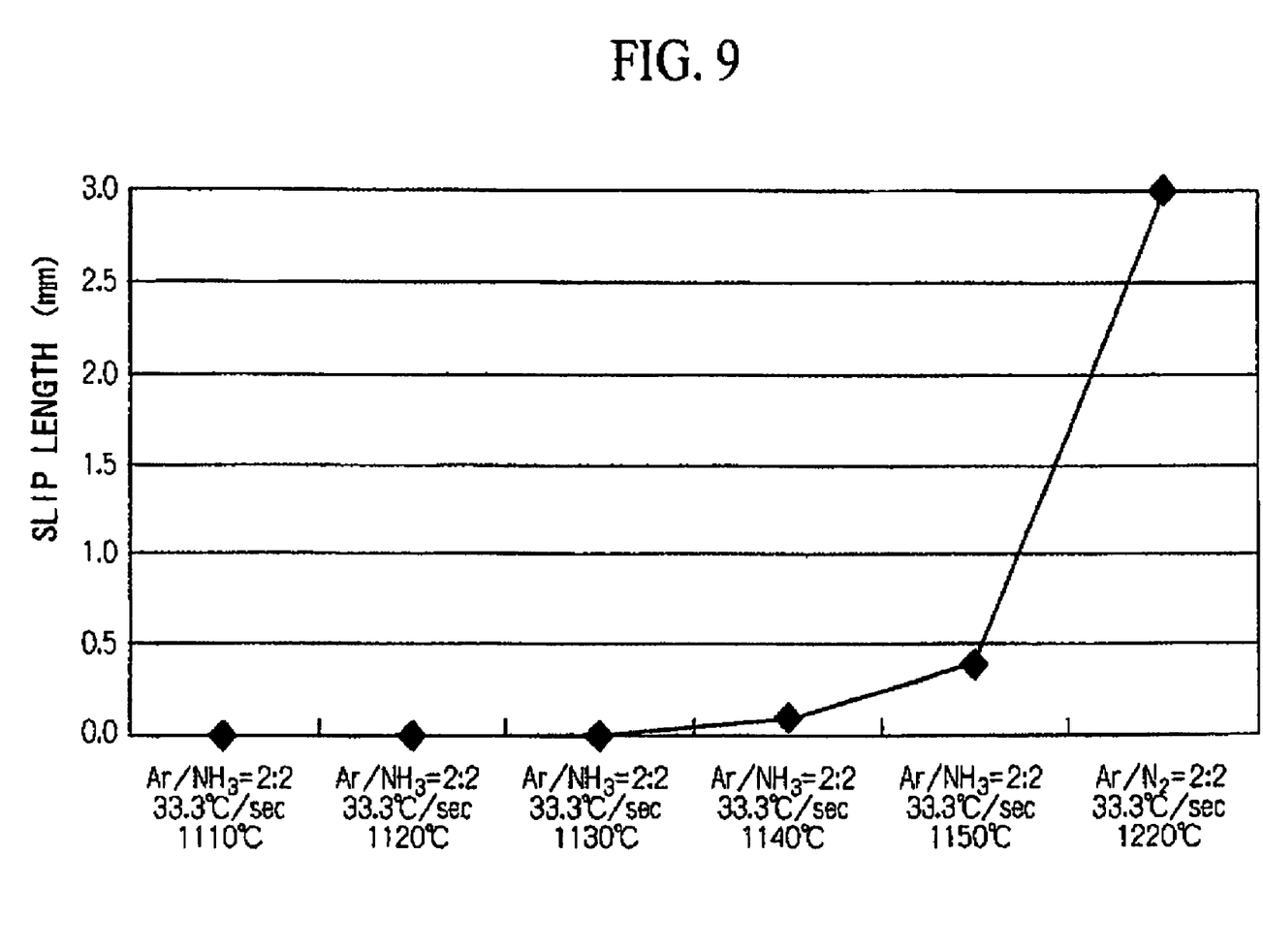
FIG. 9 is a graph showing slip lengths of the present embodiments of various thermal annealing temperatures in a production method for silicon wafers and a silicon wafer according to the present invention.

FIG. 9 shows a slip length from a pin mark when the quartz pin holds the silicon wafer, in order to clearly show the suppressive effect of slip generation by decreasing the thermal annealing temperature in the present invention (NH$_3$/Ar). The slip length is a value of the maximum interval among dislocation pits measured after 13 μm is etched off by non-agitated Secco etching. In the present invention, slip length is 0.4 mm or less, which is less than that in the conventional method (Ar/N$_2$). Furthermore, growth of slip is zero at 1130° C. or less, so that slip can be remarkably decreased.

Furthermore, in an example that the conventional RTA treatment was carried out using N$_2$/Ar as an atmosphere, and an example that silicon nitride-oxide film was formed on the surface of the silicon wafer according to the above-described embodiment, an actual composition of a surface reactive film was analyzed by an analysis combining XPS and sputtering. The results are shown in FIGS. 10A and 10B.

Figure 10A:
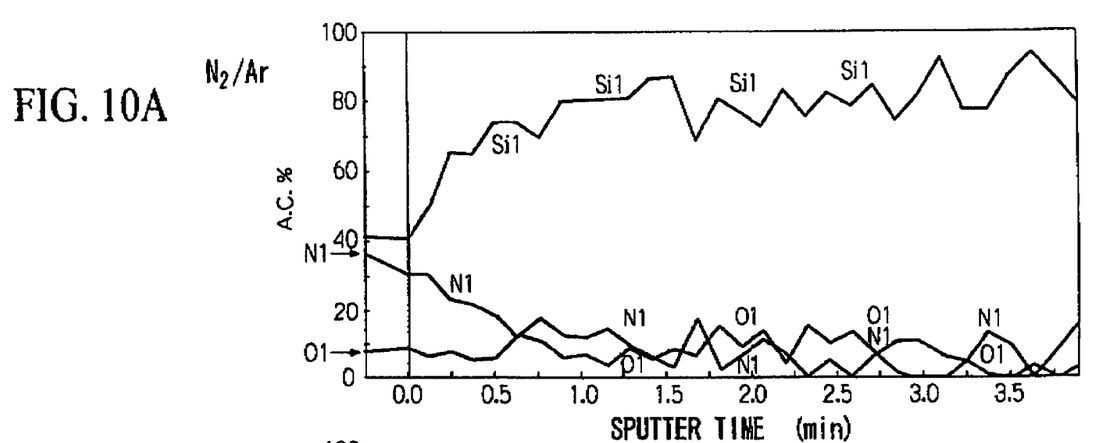
FIG. 10A is a graph showing analysis results by an element distribution measurement from the surface to the inside of silicon wafer of a conventional example in a production method for silicon wafers.
Figure 10B:
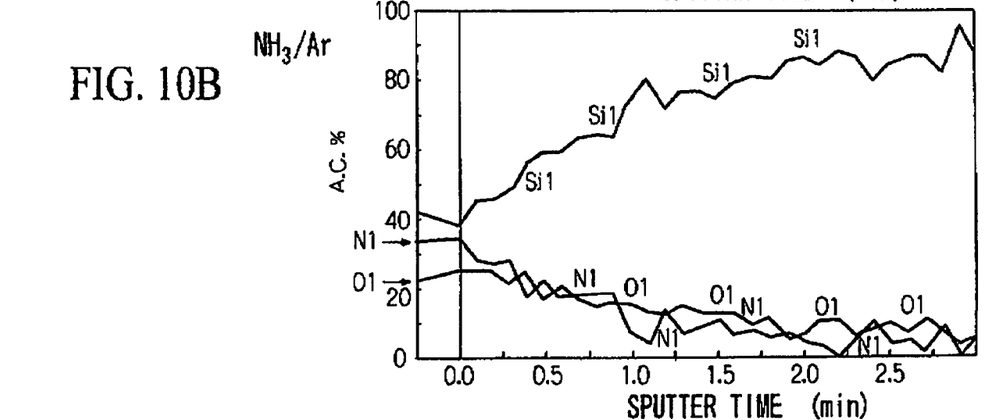
FIG. 10B is a graph showing analysis results by an element distribution measurement from the surface to the inside of silicon wafers of the present embodiments when a silicon oxynitride film is formed, in a production method for silicon wafers and a silicon wafer according to the present invention.

In the conventional example, as shown in FIG. 10A, oxygen was hardly detected in the surface layer of the silicon wafer, and silicon and nitrogen were detected. While, in the example of the present embodiment, as shown in FIG. 10B, oxygen and nitrogen were detected with the same level in the surface layer of the silicon wafer, and silicon nitride-oxide film is formed.

According to a production method for silicon wafers and a silicon wafer of the present invention, since an atmosphere in the thermal annealing step contains nitride gas having a lower decomposition temperature than decomposable temperature of N$_2$, the nitride gas is decomposed even if lower thermal annealing temperature or shorter thermal annealing time than those in N$_2$. Accordingly, since the surface of the silicon wafer is nitrided, vacancies are injected therein and generation of slip is suppressed during thermal annealing, and subsequently, by carrying out the subsequent thermal annealing, quality silicon wafers having DZ layers having sufficient thickness and suitably high BMD density therein are obtained. Particularly, the present invention is effective in silicon wafers with 300 mm diameter which are larger than 200 mm diameter wafers.

Furthermore, since the silicon wafer of the present invention has a silicon nitride-oxide film formed by nitriding the surface of the silicon wafer in the thermal annealing, sufficient amount of vacancies are injected therein and good surface morphology is provided by suppressing surface roughness. Therefore, if the thermal annealing for oxygen precipitates is carried out on the silicon wafer, the silicon wafer comprising a BMD layer having high BMD density therein and a DZ layer having satisfactory surface roughness as a surface layer is obtained.

The invention claimed is:

1. A silicon wafer, comprising:
   vacancies formed therein by a thermal annealing at a temperature of 900° C. to 1180° C. in an atmosphere including a nitride gas having a lower decomposition temperature than a decomposable temperature of N$_2$;
   a silicon nitride-oxide film on a surface thereof which is formed by nitriding the surface during the thermal annealing, the silicon nitride-oxide film containing hydrogen;
   a non-defect layer which is formed by annihilation of vacancies and interstitial silicon as at least a surface layer of the silicon wafer; and
   oxygen precipitated by utilizing the vacancies,
   wherein the BMD density in the silicon wafer is in a range from $6 \times 10^4$/cm$^2$ to less than $1 \times 10^6$/cm$^2$, and
   a slip length is 0.4 mm or less, and the slip length is a value of the maximum interval among dislocation pits measured after 13 μm is etched off by non-agitated Secco etching.

2. The silicon wafer of claim 1, wherein the diameter thereof is larger than 200 mm.

3. The silicon wafer of claim 1, wherein the diameter thereof is 300 mm.

4. The silicon wafer of claim 1, wherein the slip length is 0.1 mm or less.

5. The silicon wafer of claim 1, wherein the temperature of the thermal annealing is 900° C. to 1130° C.

6. The silicon wafer of claim 1, wherein the DZ width is 60 μm to 100 μm.

* * * * *